United States Patent
Kuo et al.

(10) Patent No.: US 7,372,153 B2
(45) Date of Patent: May 13, 2008

(54) INTEGRATED CIRCUIT PACKAGE BOND PAD HAVING PLURALITY OF CONDUCTIVE MEMBERS

(75) Inventors: Yian-Liang Kuo, Hsin-Chu (TW); Yu-Chang Lin, Hsin-Chu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 531 days.

(21) Appl. No.: 10/680,664

(22) Filed: Oct. 7, 2003

(65) Prior Publication Data

US 2005/0073058 A1    Apr. 7, 2005

(51) Int. Cl.
*H01L 23/48* (2006.01)
*H01L 23/485* (2006.01)
*H01L 29/40* (2006.01)

(52) U.S. Cl. ......... 257/758; 257/E23.03; 257/E21.508; 257/E23.144; 257/E23.267; 257/E23.02; 257/E23.152; 257/701; 257/700; 257/698; 257/696; 257/781; 257/773; 257/779; 257/780; 257/750; 257/751; 257/173

(58) Field of Classification Search .......... 257/E23.03, 257/E21.508, E23.144, E23.167, E23.02, 257/E23.152, 758, 701, 700, 698, 696, 781, 257/784, 786, 774, 773, 734, 779, 780, 750, 257/751, 173
See application file for complete search history.

(56) References Cited

U.S. PATENT DOCUMENTS

| | | | |
|---|---|---|---|
| 5,502,337 A * | 3/1996 | Nozaki .................. 257/773 |
| 5,923,088 A | 7/1999 | Shiue et al. |
| 5,942,800 A | 8/1999 | Yiu et al. |
| 6,124,198 A * | 9/2000 | Moslehi .................. 438/622 |
| 6,140,708 A * | 10/2000 | Lee et al. ................ 257/780 |
| 6,163,074 A * | 12/2000 | Lee et al. ................ 257/734 |
| 6,207,547 B1 * | 3/2001 | Chittipeddi et al. ........ 438/612 |
| 6,258,706 B1 | 7/2001 | Yiu et al. |
| 6,268,654 B1 * | 7/2001 | Glenn et al. ............. 257/704 |
| 6,287,950 B1 * | 9/2001 | Wu et al. ................ 438/612 |
| 6,306,749 B1 | 10/2001 | Lin |
| 6,306,750 B1 * | 10/2001 | Huang et al. ............ 438/612 |
| 6,313,540 B1 * | 11/2001 | Kida et al. .............. 257/784 |
| 6,313,541 B1 | 11/2001 | Chan et al. |
| 6,383,935 B1 * | 5/2002 | Lin et al. ................ 438/692 |
| 6,384,486 B2 | 5/2002 | Zuniga et al. |
| 6,448,650 B1 | 9/2002 | Saran et al. |
| 6,465,337 B1 * | 10/2002 | Lee et al. ................ 438/612 |
| 6,495,917 B1 * | 12/2002 | Ellis-Monaghan et al. .. 257/758 |
| 6,495,918 B1 * | 12/2002 | Brintzinger ............. 257/758 |
| 6,501,169 B1 * | 12/2002 | Aoki et al. .............. 257/700 |
| 6,531,384 B1 * | 3/2003 | Kobayashi et al. ......... 438/612 |
| 6,538,336 B1 | 3/2003 | Secker et al. |
| 6,552,438 B2 * | 4/2003 | Lee et al. ................ 257/784 |
| 6,555,920 B2 * | 4/2003 | Chung et al. ............ 257/779 |
| 6,703,286 B1 * | 3/2004 | Yu et al. ................. 438/401 |
| 6,710,448 B2 * | 3/2004 | Wang .................... 257/758 |
| 6,717,277 B2 * | 4/2004 | Chung et al. ............ 257/779 |

(Continued)

*Primary Examiner*—Alexander Oscar Williams
(74) *Attorney, Agent, or Firm*—Haynes Boone, LLP

(57) ABSTRACT

An integrated circuit package bond pad includes an insulating layer and an electrode located over the insulating layer. The electrode has a first surface configured to be bonded to external circuitry and a second surface opposite the first surface. A plurality of conductive members is located in the insulating layer, wherein ones of the plurality of conductive members contact the second surface of the electrode.

17 Claims, 3 Drawing Sheets

U.S. PATENT DOCUMENTS

| | | | |
|---|---|---|---|
| 6,756,675 B1 * | 6/2004 | Tanaka | 257/758 |
| 6,803,302 B2 * | 10/2004 | Pozder et al. | 438/612 |
| 6,876,059 B2 * | 4/2005 | Sano | 257/532 |
| 6,909,196 B2 * | 6/2005 | Batra et al. | 257/781 |
| 6,960,836 B2 * | 11/2005 | Bachman et al. | 257/763 |
| 7,026,721 B2 * | 4/2006 | Chen | 257/779 |
| 7,126,200 B2 * | 10/2006 | Seyyedy et al. | 257/421 |
| 2001/0000928 A1 * | 5/2001 | Lee et al. | 257/786 |
| 2002/0115280 A1 | 8/2002 | Lin et al. | |
| 2002/0145206 A1 * | 10/2002 | Park et al. | 257/782 |
| 2003/0020163 A1 * | 1/2003 | Hung et al. | 257/734 |
| 2003/0042499 A1 * | 3/2003 | Reiner | 257/173 |
| 2003/0218259 A1 * | 11/2003 | Chesire et al. | 257/786 |
| 2004/0092124 A1 * | 5/2004 | Suzuki et al. | 438/720 |
| 2004/0124513 A1 * | 7/2004 | Ho et al. | 257/678 |

* cited by examiner

INTEGRATED CIRCUIT PACKAGE BOND PAD HAVING PLURALITY OF CONDUCTIVE MEMBERS

BACKGROUND

The present disclosure relates generally to the field of integrated circuit package bond pads and, more specifically, to an integrated circuit package bond pad having a plurality of conductive members.

Semiconductor device geometries continue to dramatically decrease in size since such devices were first introduced several decades ago. Today's fabrication plants are routinely producing devices having feature dimensions less than 90 nm. Of course, such scaling has been accompanied by obstacles involving implementing new processes and equipment technology especially as device requirements become more demanding.

Typical semiconductor devices include a stack of various types of films formed over a device layer, the stack substantially comprising layers of metal and/or other conductive materials and dielectric layers interposing the conductive layers. One or more bond pads are typically formed in a topmost conductive layer, followed by a packaging layer having openings exposing the bond pads. The stack of layers can suffer internal stress due, for example, to lattice mismatches at interfaces between adjacent layers. The stress may also build-up within the stack as the device is exposed to changes in the environment, the application of force and thermal cycling during manufacturing, assembly, packaging and handling. The dielectric layers typically comprise low-k materials that are sensitive to stresses that can occur during and after manufacturing and assembly. Consequently, the stress build-up in and around the dielectric layers can cause cracking and peeling of various layers, adversely affecting device performance and reliability.

One of the processes which can contribute to the stress build-up in the stack of layers is package bonding. For example, in a wire bonding process, a small-diameter wire comprising gold and/or other conductive materials is electrically and mechanically coupled to a bond pad. Generally, one or more of the application force, thermal energy and acoustic energy used in bonding the wire causes the terminus of the wire to bond with the bond pad, thereby allowing connection of the integrated circuit package with an external feature, such as a circuit board. Wire bonding and other bonding processes induce mechanical and thermal stress in and around the bond pad, including in the conductive and dielectric layers underlying the bond pad. As discussed above, the build-up of such stress can be detrimental to the performance and reliability of the integrated circuit package and, consequently, the electronic device incorporating the integrated circuit package.

Accordingly, what is needed in the art is an integrated circuit package bond pad and method of manufacture thereof that addresses the above-discussed issues of the prior art.

SUMMARY

The present disclosure provides an integrated circuit package bond pad including an insulating layer and an electrode located over the insulating layer, the electrode having a first surface configured to be bonded to external circuitry and a second surface opposite the first surface. The bond pad also includes a plurality of conductive members located in the insulating layer, wherein ones of the plurality of conductive members contact the second surface of the electrode.

The present disclosure also provides a method of manufacturing an integrated circuit package bond pad. In one embodiment, the method includes forming an insulating layer over a substrate and forming a plurality of conductive members in the insulating layer. The method also includes forming an electrode over the insulating layer, the electrode having a first surface configured to be bonded to external circuitry and a second surface opposite the first surface and contacting ones of the plurality of conductive members.

A method of manufacturing an electronic device is also provided in the present disclosure. In one embodiment, the method includes providing a substrate having a first bond pad located thereon and providing an integrated circuit package having a second bond pad located thereon. The second bond pad includes an insulating layer and an electrode located over the insulating layer, the electrode having a first surface configured to be bonded to the first bond pad and a second surface opposite the first surface. The second bond pad also includes a plurality of conductive members located in the insulating layer, wherein ones of the plurality of conductive members contact the second surface of the electrode. The method of manufacturing an electronic device also includes forming a bond electrically coupling the first and second bond pads.

The foregoing has outlined preferred and alternative features of several embodiments so that those skilled in the art may better understand the detailed description that follows. Additional features will be described below that further form the subject of the claims herein. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure.

BRIEF DESCRIPTION OF THE DRAWINGS

The present invention is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
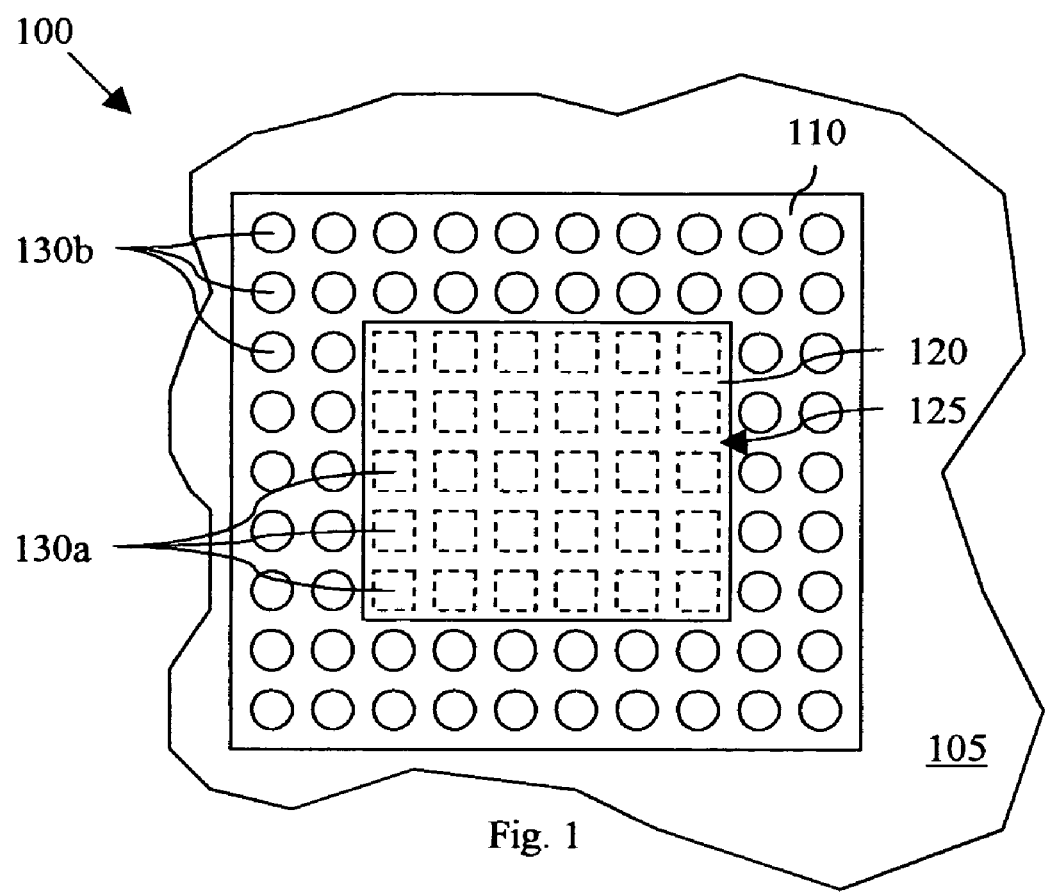
FIG. 1 illustrates a plan view of one embodiment of an integrated circuit package bond pad constructed according to aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a plan view of one embodiment of an integrated circuit package bond pad 100 constructed according to aspects of the present disclosure. The bond pad 100 includes an insulating layer 110 located over a substrate 105 and an electrode 120 located over the insulating layer 110. The substrate 105 may be a silicon or silicon-on-insulator substrate, and also contemplates a substrate having formed therein and thereon a plurality of transistors, capacitors, resistors and/or other active and passive devices, possibly including an interconnect structure comprising a plurality of conductive and dielectric layers formed over the devices. The insulating layer 110 may be formed by chemical vapor deposition (CVD), atomic layer deposition (ALD), plasma enhanced CVD (PECVD), physical vapor deposition (PVD) or other processes, and may comprise $SiO_2$, TEOS, PSG, BPSG, FSG and/or other materials. In one embodiment, the insulating layer 110 comprises TOMCATS™ or MesoELK™, products distributed by Schumacher of Carlsbad, Calif. The thickness of the insulating layer 110 is not limited by the scope of the present disclosure.

In some embodiments in which the insulating layer 110 is formed by CVD, PECVD, spin-on coating or ALD, the formation process may include the introduction of an organosilicate precursor, such as MesoELK™. Typically, such a process includes introducing oxygen, ozone and/or inert gases such as $N_2$, $H_2$ and Ar into the deposition environment to provide a porous film having gas-filled pores. Such a process may provide lower dielectric constant values than other processes.

The electrode 120 may comprise metal, doped polysilicon and/or a metal silicide, and may be formed by ALD, CVD, PVD and/or other methods. In some embodiments, a seed layer may be deposited before the bulk material forming the electrode 120 is deposited, such as in embodiments in which the electrode 120 substantially comprises copper. After deposition, the electrode 120 may be planarized, such as by a plasma or other etch-back process, or by chemical-mechanical polishing (CMP). The thickness of the electrode 120 is not limited by the scope of the present disclosure.

The embodiments described herein may be adapted for use with most integrated circuit package processing methods, including eutectic chip bonding, epoxy chip bonding, wire bonding, flip chip, solder bump bonding and others. Accordingly, the electrode 120 includes an exposed surface 125 configured to be bonded to external circuitry, devices or other elements. For example, the exposed surface 125 of the electrode 120 may be configured to receive a wire bond connected to a proximate device or substrate. The exposed surface 125 may also be configured to be surface mounted to a circuit board or other substrate. In one embodiment, the electrode 120 includes a thin film of gold, tungsten or other conductive materials on the exposed surface 125, which may improve the adhesion of the bond to external circuitry. The thin conductive film may also reduce the contact resistance of the bond to external circuitry.

The bond pad 100 also includes a plurality of conductive members 130a, 130b located in the insulating layer 110. The conductive members 130a are located substantially within the perimeter of the electrode 120, as indicated by the dashed lines outlining the conductive members 130a. The conductive members 130b are located substantially outside of the perimeter of the electrode 120. The conductive members 130a, 130b may comprise conductive material such as Cu, Al, Ag, Au, and/or Pt, and may be formed by ALD, CVD, PVD and/or other methods, possibly after forming openings in the insulating layer 110. The openings in the insulating layer 110 may be formed by a dry etch, a plasma etch or other conventional etching processes, including photolithographic processes employing a photoresist mask having openings therein corresponding to the conductive members 130a, 130b.

The conductive members 130a may also comprise non-metal materials, such as doped polysilicon or a hybrid material such as a metal silicide. The conductive members 130a, 130b may also comprise refractory barrier materials such as Ti, Ta, TiN, TaN, TiW, and/or WN, which may improve the adhesion of the conductive members 130a, 130b within the insulating layer 110, and may also prevent diffusion between the conductive members 130a, 130b and the insulating layer 110. The conductive members 130a contact the electrode 120, thereby providing a conductive path between the electrode 120 and circuitry underlying the bond pad 100.

Generally, the size and shape of the conductive members 130a, 130b may be selected to minimize stress build-up in the insulating layer 110 and the underlying stack of conductive and dielectric layers of the substrate 105. For example, a structure capable of withstanding greater stress build-up may be one in which the volumetric ratio of the conductive members 130a, 130b to the insulating layer 110 may be about 1:2. In another embodiment, a smaller volumetric ratio of the conductive members 130a, 130b to the insulating layer 110 may be desired, such as in applications in which decreased contact resistance or capacitive coupling may be of critical importance. In the illustrated embodiment, the volumetric ratio of the conductive members 130a to the insulating layer 110 is about 1:2.7. Generally, the volumetric ratio of the conductive members 130a to the insulating layer 110 may range between about 1:1 and about 1:5.

By including the plurality of conductive members 130a, 130b in the insulating layer 110 under the electrode 120, the stress build-up occurring during manufacturing and assembly of a device incorporating the bond pad 100 may be more efficiently dissipated into the insulating layer 110 and the underlying layers of the substrate 105. That is, the conductive members 130a, 130b may allow a relatively uniform distribution and dissipation of mechanically and thermally induced stress, significantly reducing the occurrence of cracking in the insulating layer 110 and the layers of the substrate 105. Moreover, the conductive members 130a, 130b may be sized and shaped to promote adhesion between the bond pad 100 and the substrate 105. Larger conductive members 130a, 130b may improve adhesion, but if they are too large they may ineffectively distribute stress. Thus, in one embodiment, the sizes and shapes of the conductive members 130a, 130b may be selected to optimize both adhesion and stress distribution.

The shapes of the conductive members 130a, 130b may be cylinders or polyhedrals, including square cubes and rectangular cubes. Moreover, one or more of the conductive members 130a, 130b may be shaped differently from other ones of the conductive members 130a, 130b. For example, in the illustrated embodiment the conductive members 130a each have a square cube shape and the conductive members 130b each have a cylindrical shape. Forming ones of the conductive members 130a, 130b in cylindrical shapes may improve the dissipation of mechanical and/or thermal stress induced on the bond pad 100 as compared to a rectangular shape.

Figure 2:
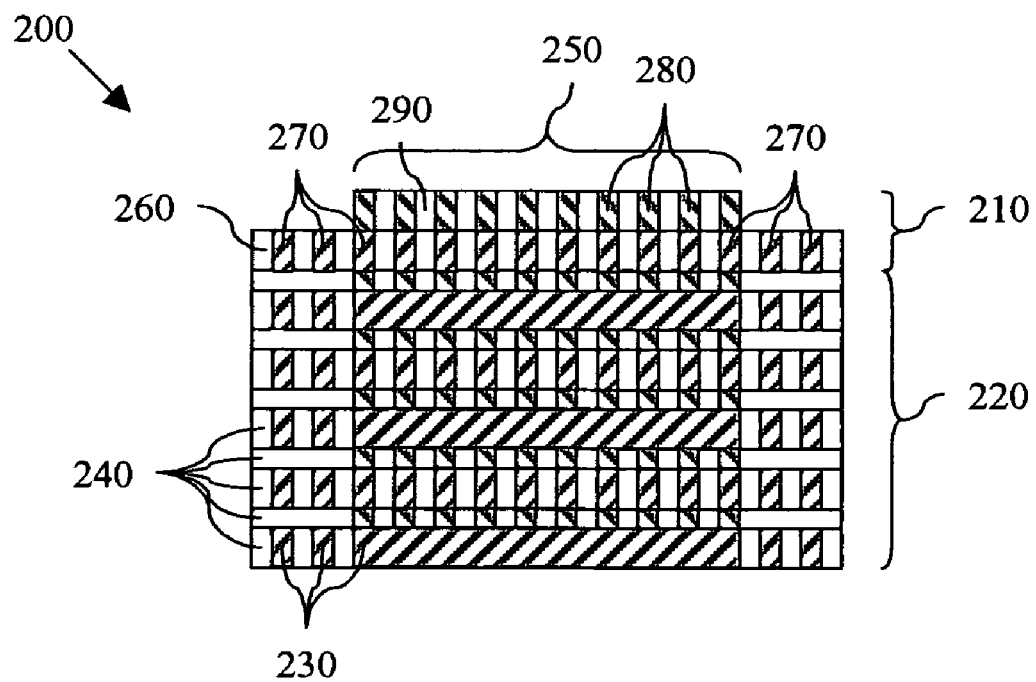
FIG. 2 illustrates a sectional view of one embodiment of an integrated circuit package constructed according to aspects of the present disclosure.

Referring to FIG. 2, illustrated is a sectional view of one embodiment of an integrated circuit package (ICP) 200 constructed according to aspects of the present disclosure. The ICP 200 is one environment in which the bond pad 100 shown in FIG. 1 may be implemented. The ICP 200 includes a bond pad 210 located over a substrate 220. The substrate 220 contemplates a substrate having formed therein and/or thereon a plurality of transistors, capacitors, resistors and/or other active and passive devices, possibly including an interconnect structure comprising a plurality of conductive and dielectric layers formed over the devices. For example, the substrate 220 in the illustrated embodiment comprises a plurality of conductive interconnects 230 located in a plurality of dielectric layers 240, such as would be found in a conventional interconnect structure formed over a device layer in an ICP.

The bond pad 210 includes an electrode 250 located over an insulating layer 260, the insulating layer having a plurality of conductive members 270 formed therein. The electrode 250, the insulating layer 260 and the conductive members 270 may be substantially similar in composition and manufacture to the electrode 120, the insulating layer 110 and the conductive members 130a, 130b shown in FIG. 1. However, whereas the electrode 120 shown in FIG. 1 may comprise a substantially continuous layer of conductive material, the electrode 250 shown in FIG. 2 may comprise a plurality of discrete conductors 280 separated by portions of a dielectric layer 290. The plurality of discrete conductors 280 may be similar in composition and manufacture to the conductive members 270, possibly with the addition of a conventional etching or other process to form openings in the dielectric layer 290 within which the discrete conductors 280 may be formed.

In embodiments incorporating a substantially continuous electrode, such as the electrode 120 shown in FIG. 1, the electrode may insufficiently distribute stress build-up in a particular application. However, by forming the electrode 250 as a plurality of discrete conductors 280 separated by portions of a dielectric layer 290, as shown in FIG. 2, the stress induced during bonding and other manufacturing and assembly processes may be more efficiently distributed.

Figure 3:
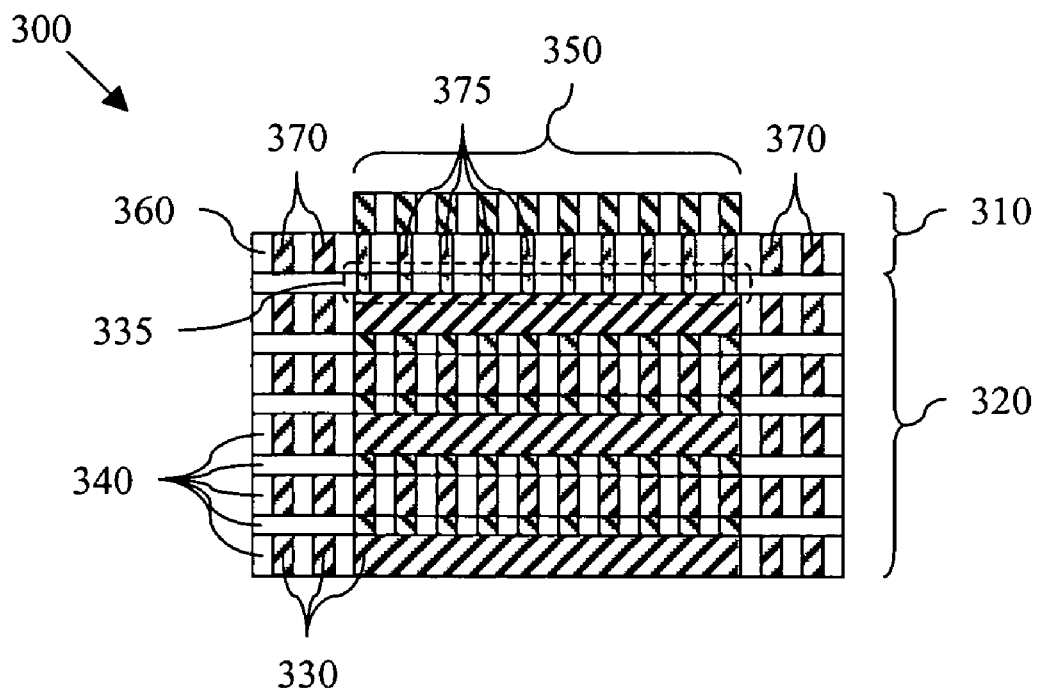
FIG. 3 illustrates a sectional view of another embodiment of an integrated circuit package constructed according to aspects of the present disclosure.

Referring to FIG. 3, illustrated is a sectional view of another embodiment of an ICP 300 constructed according to aspects of the present disclosure. The ICP 300 may be substantially similar to the ICP package 200 shown in FIG. 2. For example, the ICP 300 includes a bond pad 310 located over a substrate 320. The substrate 320 includes a plurality of conductive interconnects 330 located in a plurality of dielectric layers 340, and the bond pad 310 includes an electrode 350 located over an insulating layer 360, the insulating layer having a plurality of conductive members 370 formed therein. However, in contrast to the conductive members 270 shown in FIG. 2, the plurality of conductive members 370 includes one or more conductive members 375 that are sized differently than other ones of the conductive members 370. For example, in the illustrated embodiment the conductive members 375 are about 50% thinner than the conductive members 370. Moreover, the differently sized conductive members 375 may be substantially located within a perimeter of the electrode 350. Of course, the locations of the differently sized conductive members 375 may vary from the illustrated embodiment, and the relative sizes of the conductive members 370, 375 may vary by more or less than 50%, within the scope of the present disclosure. In addition, ones 335 of the interconnects 330, such as those employed as vias, may have widths corresponding to the widths of the conductive members 375. The conductive members 370, 375 may otherwise be similar in composition and manufacture to the conductive members 270 shown in FIG. 2.

Figure 4:
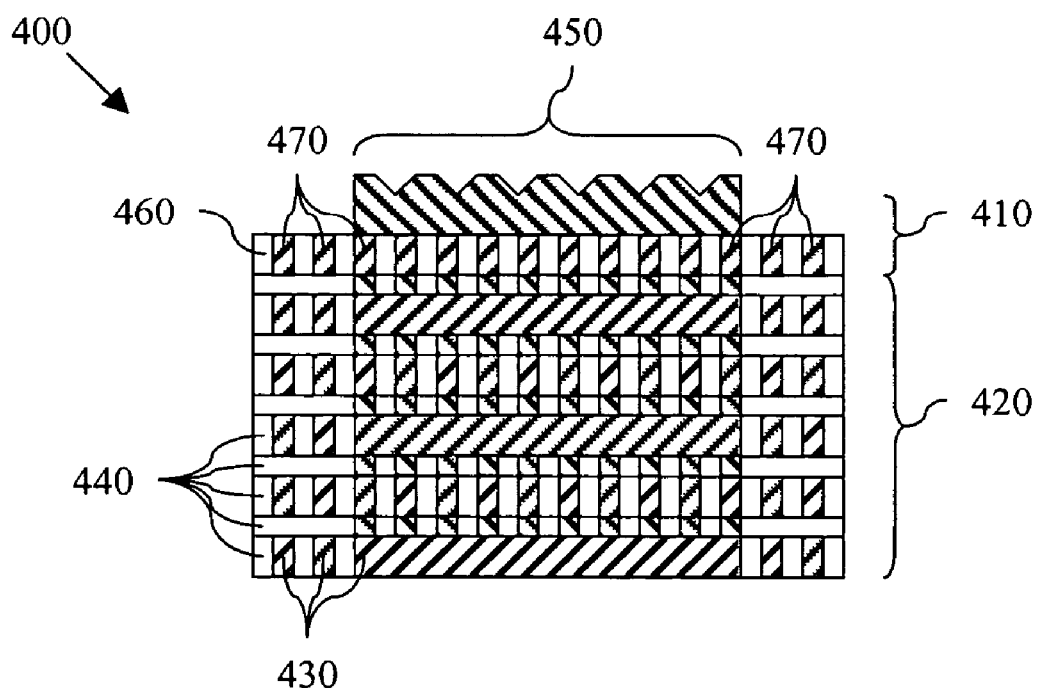
FIG. 4 illustrates a sectional view of another embodiment of an integrated circuit package constructed according to aspects of the present disclosure.

Referring to FIG. 4, illustrated is a sectional view of another embodiment of an ICP 400 constructed according to aspects of the present disclosure. The ICP 400 may be substantially similar to the ICP 200 shown in FIG. 2. For example, the ICP 400 includes a bond pad 410 located over a substrate 420. The substrate 420 includes a plurality of conductive interconnects 430 located in a plurality of dielectric layers 440, and the bond pad 410 includes an electrode 450 located over an insulating layer 460, the insulating layer having a plurality of conductive members 470 formed therein. However, in contrast to the electrode 250 shown in FIG. 2, the electrode 450 includes a serrated thickness profile. The serrated thickness profile may be formed by one or more conventional etching process, possibly employ a mask of photoresist or another conventional mask material. The serrated thickness profile need not be uniformly serrated, as shown in FIG. 4. For example, the serrated thickness profile may randomly undulate. The electrode 450 may otherwise be similar in composition and manufacture to the electrode 250 shown in FIG. 2.

Figure 5:
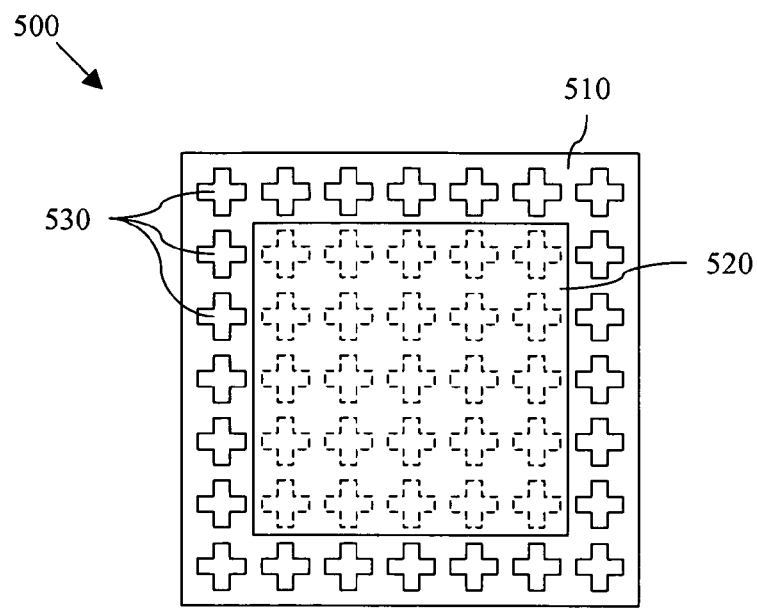
FIG. 5 illustrates a plan view of another embodiment of an integrated circuit package bond pad constructed according to aspects of the present disclosure.

Referring to FIG. 5, illustrated is another embodiment of an ICP bond pad 500 constructed according to aspects of the present disclosure. The ICP bond pad 500 may be substantially similar to the ICP bond pad 100 shown in FIG. 1. For example, the ICP bond pad 500 includes an electrode 520 located over an insulating layer 510 and a plurality of conductive members 530 located in the insulating layer 510. The insulating layer 510, the electrode 520 and the conductive members 530 may be similar in composition and manufacture to the insulating layer 110, the electrode 120 and the conductive members 130a, 130b shown in FIG. 1. However, in contrast to the shape of the conductive members 130a, 130b, the conductive members 530 shown in FIG. 5 resemble a cross-shaped polyhedron. Forming the conductive members 530 as cross-shaped polyhedrons may improve the dissipation of mechanical and/or thermal stress induced on the bond pad 500 as compared to a rectangular shape. Moreover, the cross-shaped conductive members 530 may improve adhesion between the bond pad 500 and underlying structure, and may also reduce the cracking exhibited by conventional bond pads.

Figure 6:
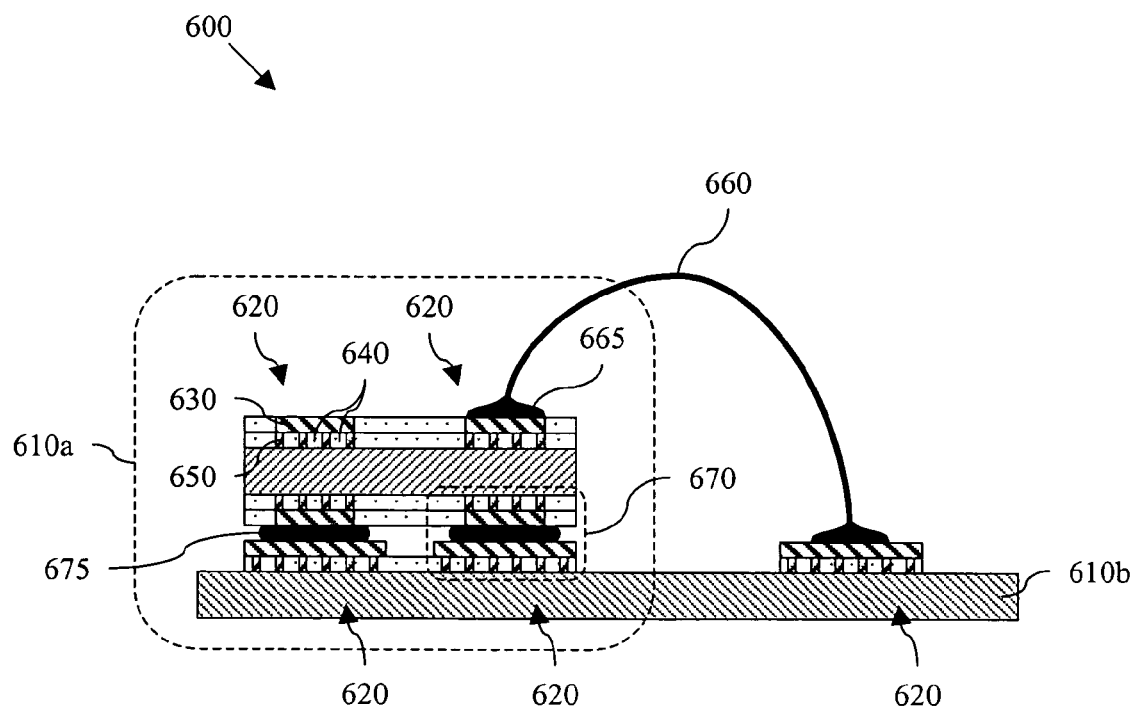
FIG. 6 illustrates a sectional view of one embodiment of an electronic device constructed according to aspects of the present disclosure.

Referring to FIG. 6, illustrated is a sectional view of one embodiment of an electronic device 600 constructed according to aspects of the present disclosure. The electronic device 600 includes several interconnected components 610. The components 610 may include integrated circuit packages 610a, which may be substantially similar in composition and manufacture to those shown in FIGS. 2-4. The components 610 may also include substrates 610b, such as circuit boards. However, at least one of the components 610a, 610b includes a bond pad 620 that may be substantially similar in composition and manufacture to those shown in FIGS. 1-5. The bond pad 620 includes an electrode 630 located over and insulating layer 640, wherein the insulating layer 640 includes a plurality of conductive members 650 providing an electrical path between the electrode 630 and underlying circuitry while also minimizing the stress build-up the conventionally occurs during manufacturing and assembly of electronic devices, as discussed above. The electrodes 630 are configured to be bonded to external circuitry by conventional package bonding methods.

For example, a wire bond 660 may interconnect the integrated circuit package 610a and the substrate 610b. At least one of the termini 665 of the wire bond 660 may be coupled to a bond pad 620 constructed according to aspects of the present disclosure. However, because the bond pad 620 includes the plurality of conductive members 650 located in the insulating layer 640 under the electrode 630, the force, thermal energy and/or acoustic energy employed to bond the terminus 665 may be sufficiently dissipated in the insulating layer 640 and the underlying structure.

The illustrated embodiment also includes a surface mount bond 670. A predetermined amount of solder or other conductive adhesive 675 may be placed between bond pads 620 of the integrated circuit package 610a and the substrate 610b. Compressive forces, thermal energy and/or acoustic energy may then be applied to couple the bond pads 620 of the integrated circuit package 610a and the substrate 610b. Again, because one or more of the bond pads 620 may include a plurality of conductive members 650 formed in an insulating layer 640 the insulating layer 640 being located between an electrode 630 and the bulk of the component 610, the stress induced by the assembly forces and energy may be sufficiently dissipated into the insulating layer 640 and the component 610, thereby decreasing the occurrence of cracking and peeling of the conductive and dielectric layers forming the component 610. Consequently, the reliability and performance of the component 610 and the electronic device 600 may be improved.

Although embodiments of the present disclosure have been described in detail, those skilled in the art should understand that they can make various changes, substitutions and alterations herein without departing from the spirit and scope of the present disclosure.

II. Election

In the Office Action mailed Mar. 9, 2005, the Examiner alleges that the application contains claims directed to the following species:
Species I: FIG. 1
Species II: FIG. 2
Species III: FIG. 3
Species IV: FIG. 4
Species V: FIG. 5
Species VI: FIG. 6

In response to the election of species requirement, Applicants elect Species I, corresponding to FIG. 1. Claims 1-3 and 5-20 are readable on the elected Species I, and are considered generic.

The invention claimed is:

1. An integrated circuit package bond pad, comprising:
an insulating layer;
an electrode located over the insulating layer and having a plurality of discrete conductors separated by portions of a dielectric layer, wherein each of the plurality of discrete conductors has a first surface configured to be bonded to external circuitry and a second surface opposite the first surface; and
a plurality of conductive members located in the insulating layer, wherein ones of the plurality of conductive members physically contact the second surface of corresponding ones of the plurality of discrete conductors of the electrode.

2. The bond pad of claim 1 wherein the plurality of conductive members each have a shape selected from the group consisting of:
a square cube;
a rectangular cube; and
a cylinder.

3. The bond pad of claim 1 wherein the plurality of conductive members each have a cross-shaped footprint.

4. The bond pad of claim 1 wherein at least two of the ones of the plurality of conductive members have a first size and at least two of the ones of the plurality of conductive members have a second size.

5. The bond pad of claim 1 wherein the ones of the plurality of conductive members are first ones each having a first shape, wherein second ones of the plurality of conductive members each have a second shape.

6. The bond pad of claim 1 wherein each of the plurality of conductive members comprises a material selected from the group consisting of:
metal;
doped polysilicon; and
metal silicide.

7. The bond pad of claim 1 wherein at least two of the plurality of conductive members are located in a portion of the insulating layer outside a perimeter of the electrode.

8. The bond pad of claim 1 wherein a volumetric ratio of the ones of the plurality of conductive members to the insulating layer ranges between about 1:1 and about 1:5.

9. The bond pad of claim 1 wherein the electrode has a serrated thickness profile.

10. A method of manufacturing an integrated circuit package bond pad, comprising:
forming an insulating layer over a substrate;
forming a plurality of conductive members in the insulating layer; and
forming an electrode over the insulating layer, the electrode having a plurality of discrete conductors separated by portions of a dielectric layer, wherein each of the plurality of discrete conductors has:
a first surface configured to be bonded to external circuitry; and
a second surface opposite the first surface and physically contacting a corresponding one of the plurality of conductive members.

11. The method of claim 10 wherein forming the plurality of conductive members includes depositing a material selected from the group consisting of:
metal;
doped polysilicon; and
metal silicide.

12. The method of claim 10 wherein the electrode has a serrated thickness profile.

13. A method of manufacturing an electronic device, comprising:
providing a substrate having a first bond pad located thereon;

providing an integrated circuit package having a second bond pad located thereon, the second bond pad including:
an insulating layer;
an electrode located over the insulating layer and having a plurality of discrete conductors separated by portions of a dielectric layer, wherein each of the plurality of discrete conductors has a first surface configured to be bonded to the first bond pad and a second surface opposite the first surface; and
a plurality of conductive members located in the insulating layer, wherein ones of the plurality of conductive members physically contact the second surface of corresponding ones of the plurality of discrete conductors of the electrode; and forming a bond electrically coupling the first and second bond pads.

14. The method of claim 13 wherein the plurality of conductive members each have a rectangular cube shape.

15. The method of claim 13 wherein a volumetric ratio of the ones of the plurality of conductive members to the insulating layer ranges between about 1:1 and about 1:5.

16. The method of claim 13 wherein the electrode has a serrated thickness profile.

17. The method of claim 13 wherein forming a bond includes a process selected from the group consisting of:
wire bonding; and
surface mounting.

* * * * *

UNITED STATES PATENT AND TRADEMARK OFFICE
CERTIFICATE OF CORRECTION

PATENT NO. : 7,372,153 B2  
APPLICATION NO. : 10/680664  
DATED : October 7, 2003  
INVENTOR(S) : Yian-Liang Kuo and Yu-Chang Lin It is certified that error appears in the above-identified patent and that said Letters Patent is hereby corrected as shown below:

Column 7, lines 48-61, cited below, should be deleted:

"II. Election

In the Office Action mailed Mar. 9, 2005, the Examiner alleges that the application contains claims directed to the following species:

Species I: FIG. 1

Species II: FIG. 2

Species III: FIG. 3

Species IV: FIG. 4

Species V: FIG. 5

Species VI: FIG. 6

In response to the election of species requirement, Applicants elect Species I, corresponding to FIG. 1. Claims 1-3 and 5-20 are readable on the elected Species I, and are considered generic."

Signed and Sealed this

Thirteenth Day of July, 2010

David J. Kappos  
*Director of the United States Patent and Trademark Office*